(12) United States Patent
See et al.

(10) Patent No.: US 7,548,593 B2
(45) Date of Patent: Jun. 16, 2009

(54) BASEBAND COMPENSATION OF AN OFFSET PHASE LOCKED LOOP

(75) Inventors: Puay Hoe Andrew See, San Diego, CA (US); Gary John Ballantyne, Christchurch (NZ); James Jaffee, Solana Beach, CA (US); Gurkanwal Kamal Sahota, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 639 days.

(21) Appl. No.: 11/228,090

(22) Filed: Sep. 15, 2005

(65) Prior Publication Data
US 2007/0058750 A1 Mar. 15, 2007

(51) Int. Cl.
*H03C 3/00* (2006.01)

(52) U.S. Cl. ............... 375/302; 375/296; 375/295; 455/73; 455/91

(58) Field of Classification Search ............... 375/302; 455/73, 91, 102; 341/144
See application file for complete search history.

(56) References Cited

U.S. PATENT DOCUMENTS

| 7,027,780 | B2 * | 4/2006 | Jensen | 455/91 |
| 7,359,680 | B2 * | 4/2008 | Klemmer | 455/102 |
| 2005/0070231 | A1 * | 3/2005 | Jensen | 455/73 |
| 2006/0109155 | A1 * | 5/2006 | Jensen | 341/144 |
| 2006/0209986 | A1 * | 9/2006 | Jensen et al. | 375/302 |
| 2008/0045162 | A1 * | 2/2008 | Rofougaran et al. | 455/73 |

FOREIGN PATENT DOCUMENTS

| EP | 1052770 A1 | 11/2000 |
| WO | 9925104 A1 | 5/1999 |

OTHER PUBLICATIONS

Taizo Yamawaki et al. "A 2.7-V GSM RF Transceiver IC," IEEE Journal of Solid-State Circuits, IEEE Service Center, Piscataway, NJ, US, vol. 32, No. 12, Dec. 1997.

* cited by examiner

*Primary Examiner*—Sudhanshu C Pathak
(74) *Attorney, Agent, or Firm*—Jiayu Xu

(57) ABSTRACT

A phase modulator faithfully reproduces higher frequency modulation using an offset phase-locked loop (OPLL) without passing excessive noise through an increased bandwidth of the OPLL. A quadrature modulator modulates information from a baseband signal onto a passband IF signal and, after a limiter strips away amplitude variations, the OPLL reproduces the phase modulation on an RF signal. The OPLL introduces a group delay that does not vary linearly with the modulation frequency and that consequently causes distortion when uncompensated. A baseband filter filters the amplitude of the baseband signal and introduces a complementary group delay that compensates for the OPLL group delay and results in a combined group delay of the baseband filter, quadrature modulator, limiter and OPLL that remains substantially constant as modulation frequency varies. Compensating for the OPLL group delay reduces distortion and the spectral energy at offset frequencies from the carrier frequency of the RF signal.

30 Claims, 6 Drawing Sheets $$(45) \quad H_{OPLL}(s) = \frac{1/C_L + R_L s}{1/C_L + R_L s + s^2/K_4 K_V}$$

$$(46) \quad \omega_n = \sqrt{\frac{K_4 K_V}{C_L}}$$

$$(47) \quad \zeta = \frac{R_L}{2}\sqrt{K_4 K_V C_L}$$

$$(48) \quad \delta = \frac{\omega_n}{2\zeta}$$

$$(49) \quad H_{OPLL}(s) = \frac{\omega_n^2 (1 + s/\delta)}{s^2 + 2\zeta\omega_n s + \omega_n}$$

$$(50) \quad \tau_{OPLL}(\omega) = -\frac{d}{d\omega}\arg\bigl(H_{OPLL}(j\omega)\bigr)\Big|_{\omega \to 0} = \frac{1}{\omega_n}\bigl(2\zeta - \omega_n/\delta\bigr) = 0$$

$$(56) \quad H_{BBF}(s) = \frac{a}{s + a}$$

$$(57) \quad a = \frac{1}{R_B C_B}$$

$$(60) \quad \tau_{BBF}(\omega) = \frac{a}{\omega^2 + a^2} \quad \text{at } \omega = 0 \text{ rad/sec} \quad \tau_{BBF}(\omega) = \frac{1}{a} = R_B C_B$$

$$(54) \quad \phi_1(t) = \arctan\left(\frac{Q}{I}\right) = \arctan\left(\frac{B \cdot \sin(\phi_1(t))}{A \cdot \cos(\phi_1(t))}\right)$$

$$(67) \quad \phi_3(t) = h_{OPLL}(t) * \arctan\left(\frac{h_{BBF}(t) * B \cdot \sin(\phi_1(t))}{h_{BBF}(t) * A \cdot \cos(\phi_1(t))}\right)$$

$$(68) \quad \phi_3(t) = h_{OPLL}(t) * \phi_1(t)$$

FIG. 5

BASEBAND COMPENSATION OF AN OFFSET PHASE LOCKED LOOP

BACKGROUND

1. Field

The present disclosure relates generally to wireless communication devices and, more specifically, to a method of compensating for distortion resulting from a phase-locked loop whose group delay varies with frequency.

2. Background

Offset phase-locked loops (OPLLs) are commonly used in radio frequency (RF) transmitters in order to reduce phase noise and suppress the level of noise transmitted into the receive bands of neighboring wireless channels. For example, OPLLs are used in transmitters that comply with the Global System for Mobile communication (GSM) standard. One difference between a phase-locked loop (PLL) and an OPLL is that an OPLL has an offset downconverter mixer as opposed to a divider in the feedback loop. An OPLL converts phase-modulated intermediate frequency (IF) signals to higher-frequency output RF signals. The phase modulation of the IF signal is reproduced at a higher frequency on the carrier RF signal output by the OPLL.

An OPLL exhibits characteristics of a low-pass filter. Higher-frequency noise is filtered out, while lower-frequency phase modulation is passed onto the output RF signal. As the loop bandwidth of the OPLL increases, more noise is transmitted at offset frequencies. There is a tradeoff, however, between the reduction in transmitted noise and an increase in phase error. If the bandwidth of the phase modulation received by the OPLL approaches the bandwidth of the OPLL, some of the phase modulation will also be filtered out, thereby increasing phase error. Wireless communications standards specify both a maximum phase error and a maximum amount of noise that may be emitted at predefined offset frequencies from the carrier frequency. As the loop bandwidth increases, noise is transmitted at greater offset frequencies. Thus, there is a usable loop bandwidth for which both the phase error and the transmitted noise do not exceed the specified thresholds.

FIG. 1 (prior art) shows the usable loop bandwidth of an OPLL employed in a GSM transceiver. A curve 10 shows that the noise level transmitted from the OPLL increases as the loop bandwidth increases beyond 1 MHz. A curve 11 shows that the phase noise increases sharply as the loop bandwidth decreases below 1 MHz. Thus, a usable bandwidth of about 1.6 MHz exists in the offset frequency ranges where both the phase error and the transmitted noise fall below the maximum thresholds specified by the GSM standard. For example, the transmitted noise must be less than −165 dBc/Hz and the phase noise must be less than 2 degrees rms. For additional information on employing an OPLL in a GSM transceiver, see Yamawaki et al, "A 2.7-V GSM RF Transceiver IC," IEEE Journal of Solid-State Circuits, Vol. 32, No. 12, December 1997. Whereas GSM uses only phase modulation, both phase modulation and amplitude modulation are used by other wireless standards, such as the Enhanced Data rates for GSM Evolution (EDGE) standard and standards based on code division multiple accessing (CDMA).

OPLLs are also used in polar RF transmitters that comply with the EDGE and CDMA standards. Polar RF transmitters perform both amplitude and phase modulation and process amplitude and phase signals separately. Designing polar transmitters that can meet the modulation fidelity requirements of the EDGE and CDMA standards by achieving the specified phase error and noise thresholds, however, is rendered more difficult by the combination of phase and amplitude modulation. When amplitude modulation is applied, the effects of phase error are more serious and result in increased spectral regrowth. Moreover, the EDGE and CDMA standards employ higher frequency modulation schemes that require larger rather than smaller loop bandwidths. Uncorrupted phase modulation is achieved with higher frequency modulation by increasing the loop bandwidth. Increasing the bandwidth of the OPLL to accommodate the faster phase modulation, however, can cause the noise thresholds specified in the EDGE and CDMA standards to be exceeded. Depending on the stringency of the wireless standard, some polar transmitters have no usable loop bandwidth where both phase error and transmitted noise fall below the specified thresholds.

FIG. 2 shows the relationship between loop bandwidth, transmitted noise and spectral regrowth in a polar RF transmitter with no usable loop bandwidth under the EDGE standard. Spectral regrowth is referred to as ORFS (output RF spectrum) in EDGE systems. A curve 12 shows that the ORFS in the output signal of the polar transmitter falls below the acceptable ORFS threshold only for loop bandwidths above 1 MHz. A curve 13 shows that transmitted noise from the polar transmitter falls below the acceptable noise threshold only for loop bandwidths less than 1 MHz. Thus there is no usable loop bandwidth for which both the ORFS and the transmitted noise fall below the maximum thresholds specified by the EDGE standard.

One method of increasing the usable modulation bandwidth involves dual-point modulation. Dual-point modulation allows an OPLL faithfully to reproduce high frequency modulation without passing excessive noise. In dual-point modulation, the modulation bandwidth and the bandwidth of the loop of the OPLL are decoupled by separately modulating the OPLL input signal (the reference signal received by the phase detector) and the control signal to the voltage controlled oscillator (VCO). Thus, the frequency output by the VCO is not controlled entirely by the signal output by the loop filter of the OPLL. The carrier RF signal can therefore be modulated without being restricted by the loop bandwidth and the OPLL dynamics. A smaller bandwidth of the OPLL can be maintained that does not pass excessive noise, while higher frequency modulation can be faithfully reproduced in the output RF signal. For additional information on dual-point modulation, see Neurauter et al., "GSM 900/DCS 1800 Fractional-N Modulator with Two-Point-Modulation," IEEE MTT-S, International Microwave Symposium 2002, pp. 425-428, and Hunter et al., "Using Two-Point Modulation to Reduce Synthesizer Problems When Designing DC-Coupled GMSK Modulators," MX-COM, Inc., Winston-Salem, N.C., December 2002, 12 pages.

Achieving acceptable performance from polar transmitters that employ dual-point modulation can be difficult, however, because dual-point modulation is sensitive to the gain of the two paths of the modulation. The loop gain of the OPLL must be precisely matched to the gain of the path of the modulated reference signal received by the phase detector. The matching is difficult because each component of the loop contributes to the loop gain. The gain of the VCO, for example, is particularly sensitive to temperature and part-to-part deviations. The modulation fidelity of the polar transmitter degrades as the gains of the two modulation paths diverge.

A polar transmitter is sought that does not require the precise matching of gain in multiple modulation paths, but yet that accommodates faster phase modulation with a wide usable loop bandwidth without transmitting noise above the thresholds specified in the EDGE and CDMA standards. In addition, a method is sought for faithfully reproducing higher frequency modulation using an OPLL without passing excessive noise through the OPLL.

SUMMARY

A phase modulator faithfully reproduces higher frequency modulation using an offset phase-locked loop (OPLL). A method reduces phase error without increasing the bandwidth of the OPLL and thus without allowing excessive noise to pass through the OPLL. The phase modulator includes baseband filters, a quadrature modulator, a limiter and the OPLL. The quadrature modulator modulates information from filtered baseband I and Q signals onto a passband intermediate frequency (IF) signal. The limiter then strips away any variation in the amplitude of the passband IF signal. The OPLL then reproduces the phase modulation of the limited passband IF signal onto an output RF signal. A polar transmitter receives the output RF signal, performs amplitude modulation and then transmits a transmitted RF signal. The OPLL acts as a low-pass filter by filtering out higher-frequency noise and passing the lower-frequency phase modulation onto the output RF signal. If the loop bandwidth of the OPLL is decreased in order to filter out more noise, however, the phase error increases as the OPLL introduces more group delay to the output RF signal.

The group delay introduced by the OPLL varies with the modulation frequency and consequently causes distortion if left uncompensated. Distortion causes phase error and increases the amount of spectral energy at offset frequencies from the carrier frequency of the transmitted RF signal. The distortion can be decreased by increasing the bandwidth of the OPLL. Increasing the bandwidth of the OPLL, however, increases the amount of noise that passes through the OPLL.

A method of compensating for the non-constant group delay of the OPLL allows the distortion to be reduced without increasing the bandwidth of the OPLL. Baseband filters filter the amplitude of baseband I and Q signals to generate the filtered baseband I and Q signals. The quadrature modulator receives the filtered baseband I and Q signals and generates the phase-modulated IF signal. By filtering the amplitude of the baseband I and Q signals, a complementary group delay is introduced that compensates for the group delay of the OPLL. The combination of the baseband-filter group delay and the OPLL group delay more closely resembles a constant function of modulation frequency than does the OPLL group delay alone. Filtering the baseband I and Q signals results in a combined group delay of the baseband filters, the quadrature modulator, the limiter and the OPLL that is more nearly constant with varying modulation frequency. Compensating for the OPLL group delay reduces phase error in the output RF signal, as well as the amount of spectral energy at offset frequencies from the carrier frequency in the RF signal transmitted from the polar transmitter.

In one embodiment, the group delay of the OPLL is zero at a modulation frequency of zero Hertz. The OPLL has a maximum group delay at a non-zero modulation frequency. The method compensates for the OPLL group delay by adjusting the baseband filters to have a group delay at zero Hertz approximately equal to the maximum group delay of the OPLL.

A circuit reduces distortion by compensating for the group delay of an OPLL with the group delay of baseband filters. The baseband filters filter the amplitude of I and Q signals and introduces a group delay. A quadrature modulator receives the filtered I and Q signals and outputs a phase-modulated passband signal. A limiter limits the amplitude of the phase-modulated passband signal. The OPLL filters the phase of the limited phase-modulated passband signal, introduces a group delay and outputs an output signal. A polar transmitter receives the output signal, modulates the amplitude and outputs a transmitted signal. The group delay of the baseband filters compensates for the group delay of the OPLL such that distortion in the signal output by the OPLL is reduced, and the amount of spectral energy in the signal transmitted at offset frequencies by the polar transmitter is reduced. The output signal of the circuit exhibits phase error and noise. As the bandwidth of the OPLL decreases, the phase error increases and the noise decreases. The circuit allows the phase error and the noise simultaneously to be reduced.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 5 is a diagram of transfer function equations describing the operation of the phase modulator of FIG. 3;

DETAILED DESCRIPTION

Reference will now be made in detail to some embodiments of the invention, examples of which are illustrated in the accompanying drawings.

Figure 1:
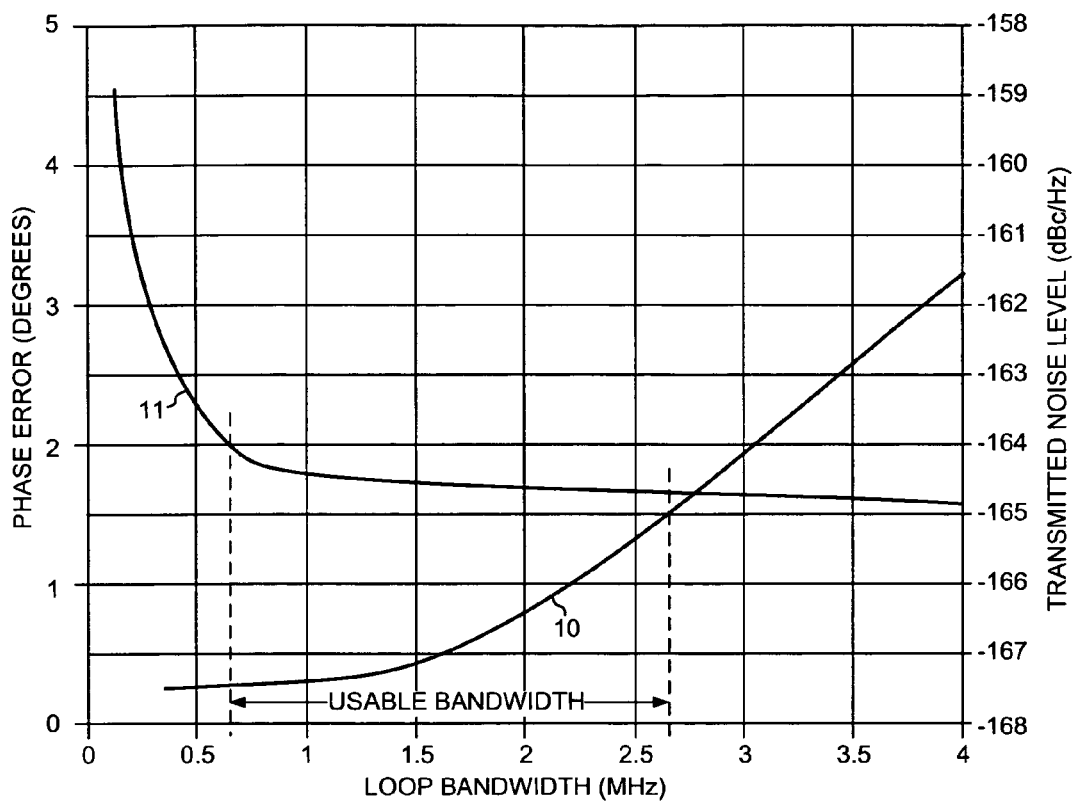
FIG. 1 (prior art) is a graph of the relationship between phase error, transmitted noise and the loop bandwidth of an offset phase-locked loop (OPLL) in a GSM system.
Figure 2:
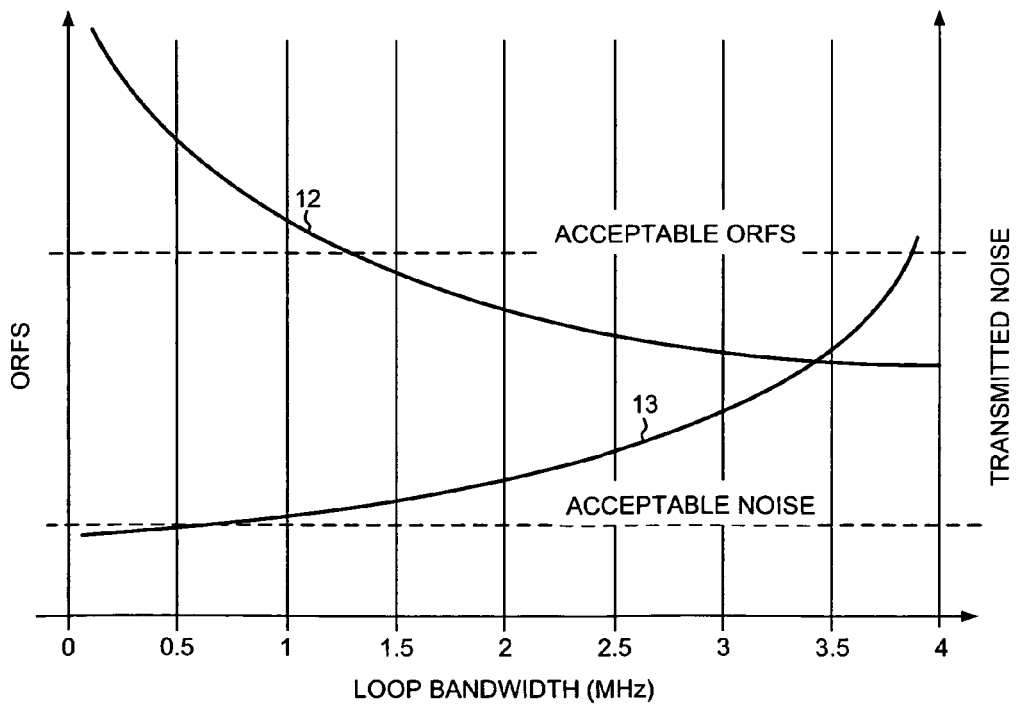
FIG. 2 a graph of the relationship between spectral regrowth, transmitted noise and the loop bandwidth of an OPLL in a polar transmitter.
Figure 3:
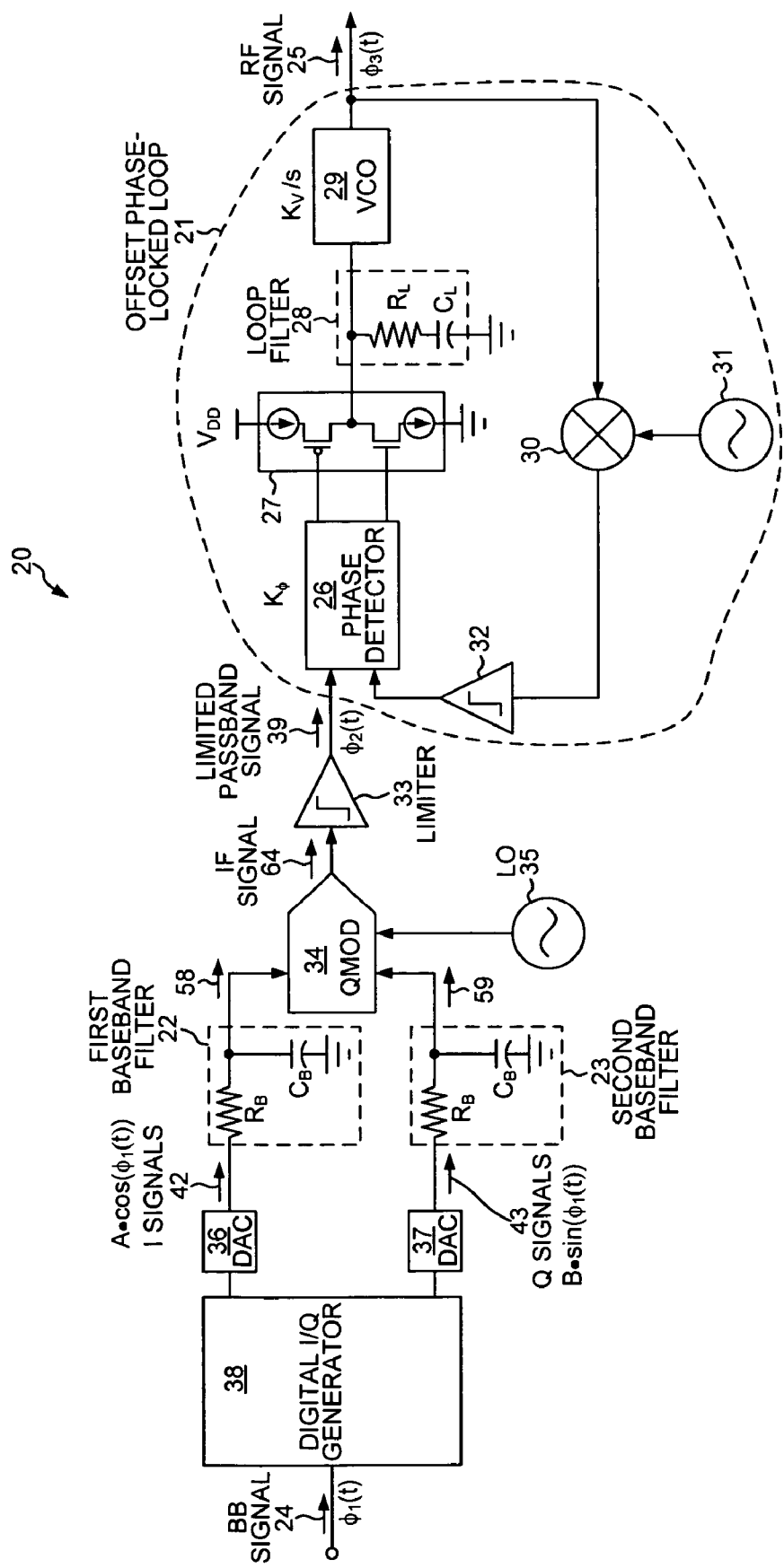
FIG. 3 is a simplified block diagram of a phase modulator that includes baseband filters and an OPLL, wherein the group delay of the baseband filters compensates for the group delay of the OPLL.

FIG. 3 is a simplified block diagram of a phase modulator 20 in a mobile station that includes an offset phase-locked loop (OPLL) 21, a first baseband filter 22 and a second baseband filter 23. Phase modulator 20 is part of a polar EDGE transmitter that performs both amplitude and phase modulation. After phase modulator 20 performs phase modulation, other circuitry of the polar transmitter performs amplitude modulation. Phase modulator 20 receives a digital baseband signal 24 containing information and outputs that information modulated onto a higher frequency radio frequency (RF) signal 25. Other circuitry of the polar EDGE transmitter receives RF signal 25, performs amplitude modulation and outputs a transmitted RF signal. The transmitted RF signal is transmitted via an antenna from the mobile station to a base station.

OPLL 21 includes a phase detector 26, a charge pump 27, a loop filter 28, a voltage-controlled oscillator 29, a mixer 30, an oscillator 31 and a limiter 32. OPLL 21 is a type-2, second-order charge-pump phase-locked loop. Phase modulator 20 also includes an additional limiter 33, a quadrature modulator 34, a local oscillator 35, two digital-to-analog converters 36-37 and a digital I/Q generator 38. Employing baseband filters 22-23 in conjunction with OPLL 21 expands the usable loop bandwidth in which both the transmitted noise and the phase error are below the maximum thresholds specified by the EDGE standard. An expanded usable loop bandwidth allows phase modulator 20 to modulate information onto a carrier signal using modulation and coding schemes (MCSs) that require higher modulation frequencies. For example, phase modulator 20 is suitable for performing modulation using the highest five MCSs 5 through 9, which use octal phase shift keying (8-PSK). Without the application of baseband filters 22-23, the group delay of OPLL 21 would cause distortion that would reduce the usable loop bandwidth.

Figure 4:
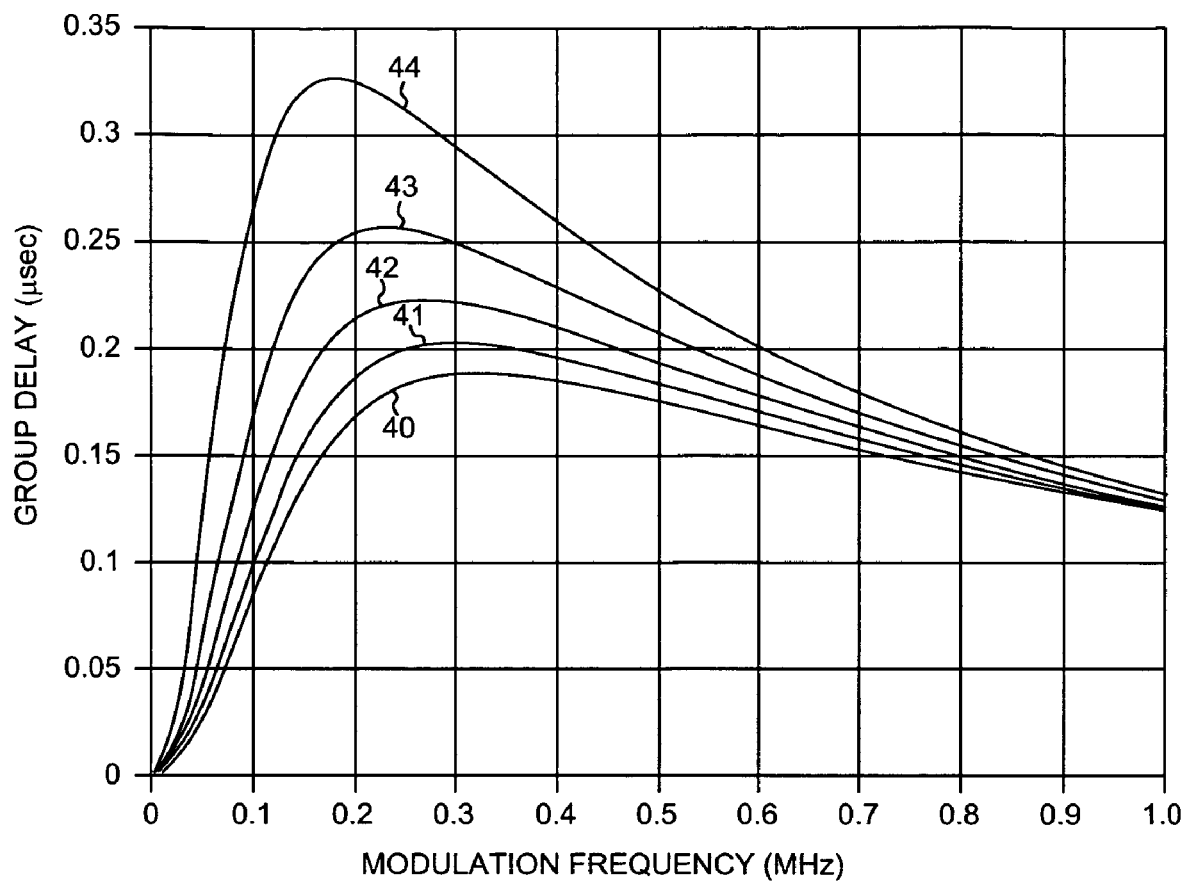
FIG. 4 is a graph of the relationship between modulation frequency and the group delay of the OPLL of FIG. 3.

FIG. 4 shows how the group delay for various embodiments of OPLL 21 varies as a function of modulation frequency. OPLL 21 locks to the frequency of an input signal and outputs a signal having a frequency that is a multiple of the input frequency. In this example, OPLL 21 receives a limited passband intermediate frequency (IF) signal 39 with a frequency of about 100 MHz and outputs RF signal 25 with a frequency of about 900 MHz. Where IF signal 39 is modulated, OPLL 21 reproduces the modulation on RF signal 25. As the modulation frequency increases and the phase of IF signal 39 changes rapidly, however, the dynamics of the loop can no longer respond fast enough to generate a faithful reproduction of the modulation. As the modulation bandwidth approaches the bandwidth of OPLL 21 and OPLL 21 begins to filter out parts of the modulated spectrum, the phase between a frequency modulated into IF signal 39 and a corresponding frequency modulated on RF signal 25 departs more and more from a constant function of the modulation frequency. Thus, the group delay of OPLL 21 increasingly varies with modulation frequency, and distortion increases.

Curves 40-44 correspond to group delays for loop bandwidths of 3.0 MHz, 2.5 MHz, 2.0 MHz, 1.5 MHz and 1.0 MHz, respectively. The loop bandwidth of OPLL 21 is primarily influenced by the time constant of loop filter 28. In the embodiment of FIG. 3, loop filter 28 is a simple pole with a resistor $R_L$ and a capacitor $C_L$. Distortion is most severe where the loop bandwidth is the narrowest. Curve 44 shows that the group delay of OPLL 21 varies significantly over a loop bandwidth of 1.0 MHz and departs significantly from being a constant value. For example, the group delay is zero at a modulation frequency of zero (the carrier frequency), whereas the group delay increases to about 0.325 microseconds at a modulation frequency of about 0.18 MHz. Then the group delay decreases to about 0.13 microseconds at a modulation frequency of about 1 MHz. Left uncompensated, this non-constant group delay can cause significant phase error in RF signal 25, as well as significant spectral energy at offset frequencies from the carrier frequency in the transmitted RF signal. Polar transmitters that do not compensate for non-constant group delay may have no OPLL bandwidth in which both the phase error and the transmitted noise fall below the maximum thresholds specified by the EDGE standard. Increasing the loop bandwidth to reduce distortion may decrease the amount of noise that is filtered out such that the threshold of emitted noise at predefined offset frequencies is exceeded.

FIG. 5 shows equations that represent the operation of phase modulator 20. Equation 45 is the transfer function $H_{OPLL}(s)$ for OPLL 21 in the s-domain, expressed in terms of the resistance of resistor $R_L$, the capacitance of capacitor $C_L$, the gain ($K_\phi$) of phase detector 26, and the gain ($K_V$) of VCO 29. Equation 45 can be written in a more convenient form by expressing the transfer function in terms of $\omega_n$, $\zeta$ and $\delta$, where $\omega_n$ is the natural frequency of the system and $\zeta$ is the damping factor. $\omega_n$, $\zeta$ and $\delta$, as shown in equations 46-48, respectively, are in turn expressed in terms of $R_L$, $C_L$, $K_\phi$ and $K_V$. Equation 49 shows the convenient form of the transfer function $H_{OPLL}(s)$ in the s-domain. OPLL 21 can also be described by its transfer function $H_{OPLL}(j\omega)$ in the frequency domain and its impulse response $h_{OPLL}(t)$ in the time domain.

An equation 50 shows the group delay $\tau_{OPLL}(\omega)$ of OPLL 21 at a modulation frequency of zero and can be derived from the transfer function $H_{OPLL}(s)$ of equation 49. The group delay $\tau_{OPLL}(\omega)$ is the negative derivative of the phase for the transfer function $H_{OPLL}(j\omega)$ in the frequency domain. Equation 50 indicates that the group delay of OPLL 21 is zero at a modulation frequency of 0 MHz. This corresponds to the group delay at the modulation frequency of 0 MHz shown for each of the curves 40-44 of FIG. 4.

Figure 6:
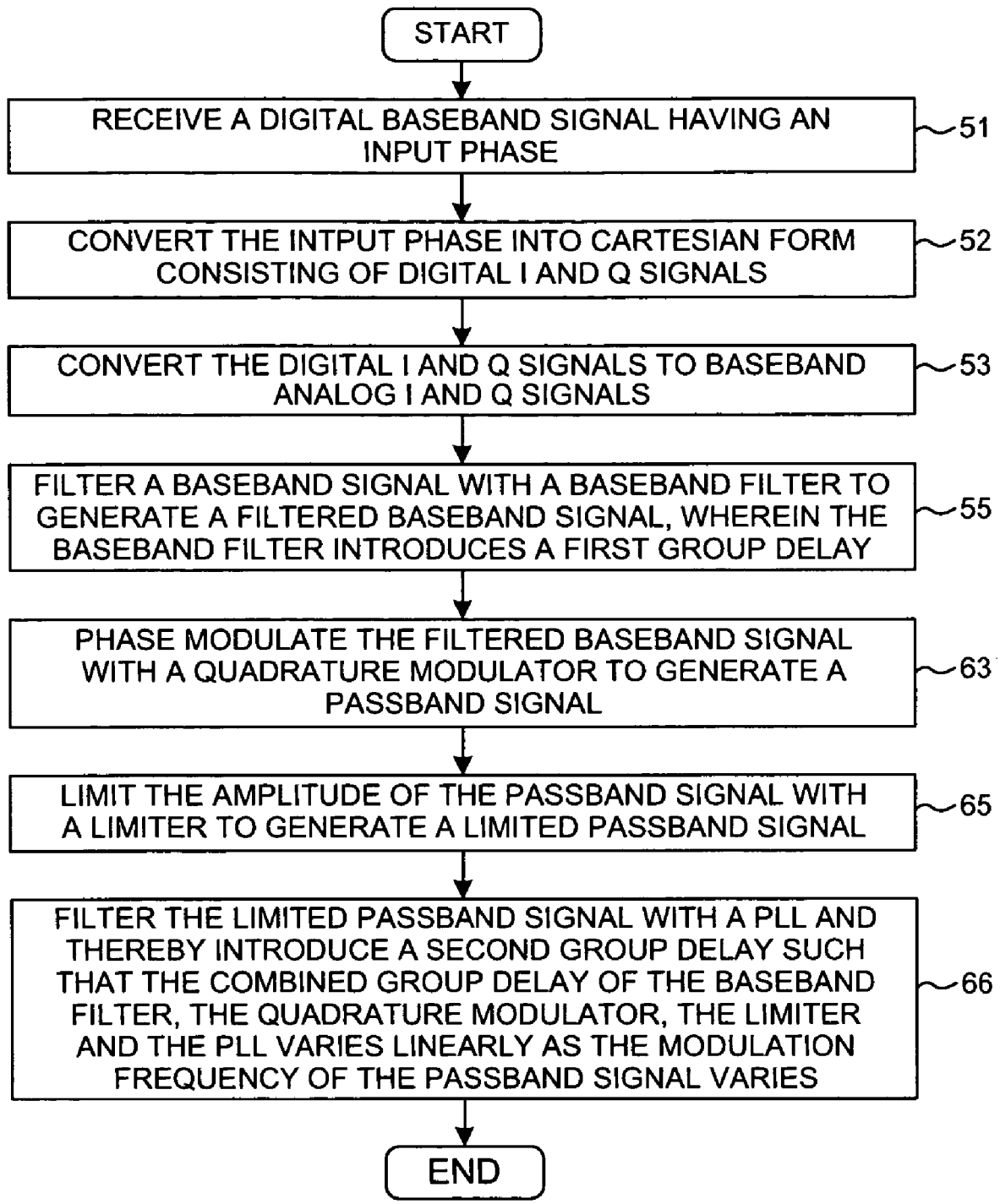
FIG. 6 is a flowchart of steps for compensating for the group delay of the OPLL in order to reduce the phase error in the signal output by the phase modulator of FIG. 2.

FIG. 6 is a flowchart of steps for faithfully reproducing higher frequency modulation using an offset phase-locked loop having a relatively narrow bandwidth that does not pass excessive noise. The steps illustrated in FIG. 6 are performed by phase modulator 20 of FIG. 3. The steps illustrate a method of compensating for the non-constant group delay of OPLL 21 in order to reduce the phase error in RF signal 25 output by phase modulator 20.

In an initial step 51, phase modulator 20 receives digital baseband signal 24 having an input phase $\phi_1(t)$ that varies as a function of time. In a step 52, digital I/Q generator 38 then converts the input phase $\phi_1(t)$ into a Cartesian form consisting of digital I and Q signals. In a step 53, digital-to-analog converters 36-37 convert the digital I and Q signals to analog in-phase (I) signal 42 and analog quadrature (Q) signal 43, respectively. The I signal 42 can be expressed as A times cos $[\phi_1(t)]$, where A is the amplitude. The Q signal 43 can be expressed as B times sin $[\phi_1(t)]$, where B is the amplitude. Equation 54 in FIG. 5 shows the relationship between the input phase $\phi_1(t)$ and baseband I and Q signals 42-43, where that amplitude A equals the amplitude B.

In a step 55, the baseband I signal 42 is filtered by first baseband filter 22, and the baseband Q signal 43 is filtered by second baseband filter 23. In this embodiment, baseband filters 22-23 have the same structures. Each of baseband filters 22-23 has a resistor $R_B$ and a capacitor $C_B$ and exhibits a transfer function $H_{BBF}(s)$ in the s-domain as shown by an equation 56 in FIG. 5. An equation 57 indicates that the term "a" in equation 56 is the reciprocal of the RC time constant of the baseband filters. Each of baseband filters 22-23 also exhibits a corresponding impulse response $h_{BBF}(t)$ in the time domain. First baseband filter 22 introduces a group delay to a filtered baseband I signal 58. Second baseband filter 23 also introduces a group delay to a filtered baseband Q signal 59. The group delay $\tau_{BBF}(\omega)$ of baseband filters 22-23 is described by equation 60 of FIG. 5, where the frequency $\omega$ is expressed as radians per second. Equation 60 can be derived from the transfer function $H_{BBF}(s)$ of equation 56 and is the negative derivative of the phase for the transfer function $H_{BBF}(j\omega)$ in the frequency domain. Equation 60 shows that the group delay of baseband filters 22-23 at a modulation frequency of zero is the reciprocal of "a", which is the RC time constant of baseband filters 22-23. As the modulation frequency increases, the group delay of baseband filters 22-23 decreases. Thus, baseband filters 22-23 are complementary to OPLL 21 because the combination of the group delays of the baseband filters and the offset phase-locked loop tends to exhibit a more nearly constant relationship to modulation frequency than does the group delay of OPLL 21 alone.

Figure 7:
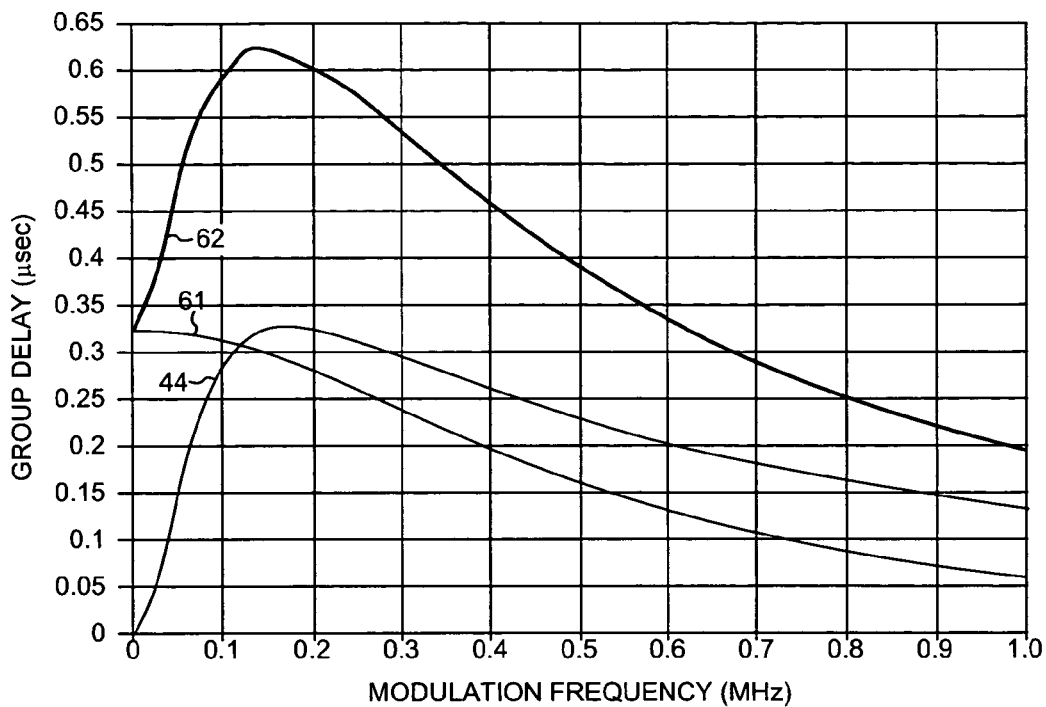
FIG. 7 is a graph of the relationship between modulation frequency and the group delay of the baseband filters of FIG. 3 for four values of the RC time constant.

FIG. 7 shows the durations of the group delay of baseband filters 22-23 for four values of the RC time constant at modulation frequencies between zero Hertz and 1 MHz. Curve 44 from FIG. 4 is reproduced showing the group delay of OPLL 21 where the loop bandwidth is 1.0 MHz. A curve 61 shows the group delay of baseband filters 22-23 where the RC time constant is set at 0.325 microseconds, the maximum value of the group delay of OPLL 21 in curve 44. The time constant of 0.325 microseconds corresponds to a bandwidth of about 490 radians/sec. Although it is not entirely accurate to sum group delays in a nonlinear system, a curve 62 approximates the combination of the group delay of OPLL 21 and the group delay of baseband filters 22-23 by showing the sum of curves 44 and 61. The combination of the group delay of OPLL 21 and the group delay of baseband filters 22-23 has a relationship to modulation frequency that is more nearly constant than is the relationship of the group delay of OPLL 21 alone to modulation frequency as shown in curve 44.

In a step 63, quadrature modulator 34 receives filtered baseband I signal 58 and filtered baseband Q signal 59. Quadrature modulator 34 shifts the filtered I and Q signals 58-59 to a higher intermediate frequency (IF) and outputs a phase-modulated IF signal 64. In the quadrature modulator 34, the filtered I and Q signals are mixed up to the intermediate frequency with a local oscillator signal provided by local oscillator 35. The filtered I and Q signals 58-59 are baseband signals and contain information as single numbers. For example, information is contained in the amplitude of filtered I signal 58. On the other hand, IF signal 64 is a passband signal and contains information as pairs of numbers. For example, information is conveyed in IF signal 64 as an amplitude and associated phase.

In a step 65, limiter 33 receives phase-modulated IF signal 64 and strips away any variation in amplitude, leaving only a phase-modulated carrier signal at the intermediate frequency. Limiter 33 outputs limited passband signal 39 with a phase phase $\phi_2(t)$.

In a step 66, OPLL 21 receives limited passband signal 39, filters limited passband signal 39, and thereby introduces a second group delay. OPLL 21 introduces the second group delay as OPLL 21 acts as a low-pass filter, filtering out higher-frequency noise in limited passband signal 39 and passing lower-frequency phase modulation onto RF signal 25. Phase detector 26 compares the phase of a feedback signal from limiter 32 to the phase of limited passband signal 39. Depending on the phase difference, phase detector 26 outputs up and down control signals causing charge pump 27 to add charge to and subtract charge from its output lead. The voltage on the output lead of charge pump 27, after being filtered by loop filter 28, becomes the control voltage for voltage-controlled oscillator 29. Voltage-controlled oscillator 29 outputs RF signal 25 having a higher frequency when the control voltage increases and a lower frequency when the control voltage decreases. Mixer 30 receives RF signal 25 and mixes RF signal 25 down to a lower frequency using a signal generated by mixer 30. The lower frequency signal is then limited by limiter 32 to produce the feedback signal.

By filtering the baseband I and Q signals 42-43 in step 55 and thereby introducing the first group delay, the combined group delay of baseband filters 22-23, quadrature modulator 34, limiter 33 and OPLL 21 remains substantially constant with varying modulation frequency.

Empirical results show that the distortion of phase modulator 20 is smallest for a bandwidth of baseband filters 22-23 that results in a group delay of the filters at zero Hertz that is approximately equal to the maximum group delay of OPLL 21. The presence of limiter 33 between baseband filters 22-23 and OPLL 21 causes the combined group delay of baseband filters 22-23, quadrature modulator 34, limiter 33 and OPLL 21 to depart from the sum, as shown by curve 62 of FIG. 7, of the group delays of baseband filters 22-23 and OPLL 21. Moreover, it has been empirically determined that group delay contributes more to distortion than do errors in amplitude response. Thus, where the baseband filters 22-23 are adjusted such that their group delay at zero Hertz approximately equals the maximum group delay of OPLL 21, the combined group delay of the components of phase modulator 20 remains most nearly constant as the modulation frequency of IF signal 39 varies. Therefore, for the embodiment of FIG. 3, the best compensation for a group delay of OPLL 21 that varies with modulation frequency is achieved by setting the time constant of baseband filters 22-23 to the maximum duration of the second group delay, which is about 0.325 microseconds, as shown in curve 61 of FIG. 7. The actual combined group delay of baseband filters 22-23, quadrature modulator 34, limiter 33 and OPLL 21 more nearly resembles a constant function of modulation than the relationship shown by curve 62 of FIG. 7 because of the effects of limiter 33.

The actual combined group delay exhibited by phase modulator 20 cannot be expressed simply by cascading the transfer functions of baseband filters 22-23 and OPLL 21. Firstly, baseband filters 22-23 filter the amplitudes of baseband I and Q signals 42-43, whereas OPLL 21 filters the phase of limited passband signal 39. An equation 67 in FIG. 5 represents the output phase $\phi_3(t)$ as a function of the impulse response $h_{OPLL}(t)$ in the time domain of OPLL 21 convolved with the phase $\phi_2(t)$ received by OPLL 21. The output phase $\phi_3(t)$ cannot be calculated using the group delay of baseband filters 22-23 instead of their impulse response because baseband filters 22-23 filter amplitude as opposed to phase. The received phase $\phi_2(t)$ is expressed as the arctangent of an expression containing a function of the impulse response $h_{BBF}(t)$ in the time domain of baseband filters 22-23. Moreover, the two impulse response functions $h_{BBF}(t)$ do not cancel each other out because they are convolved with I and Q signals 42-43 (A·cos [$\phi_1(t)$] and B·sin [$\phi_1(t)$]) as opposed to being multiplied by the I and Q signals.

Secondly, limiter 33 renders the combined transfer function of phase modulator 20 non-linear. Because the varying amplitudes of IF signal 64 are stripped away, the actual contribution of the first group delay from baseband filters 22-23 differs from the group delay expressed by equation 60. Consequently, limiter 33 causes the output phase $\phi_3(t)$ in equation 67 in FIG. 5 to be expressed in terms of the arctangent function because the amplitude components are stripped from the associated phase information. Thus, an exact mathematical formulation of the combined group delay is exceedingly complex, so the actual combined group delay exhibited by phase modulator 20 is determined empirically. Nevertheless, equation 67 does show that as the bandwidth of baseband filters 22-23 increases to infinity, the impulse response $h_{BBF}(t)$ approaches a delta function, and the output phase $\phi_3(t)$ becomes the input phase $\phi_1(t)$ convolved with the impulse response $h_{OPLL}(t)$ of OPLL 21. An equation 68 shows the output phase $\phi_3(t)$ when the baseband filters have an infinitely wide bandwidth. In that case, the group delay of baseband filters 22-23 (the first group delay) does not add to the group delay of OPLL 21 (the second group delay).

Figure 8:
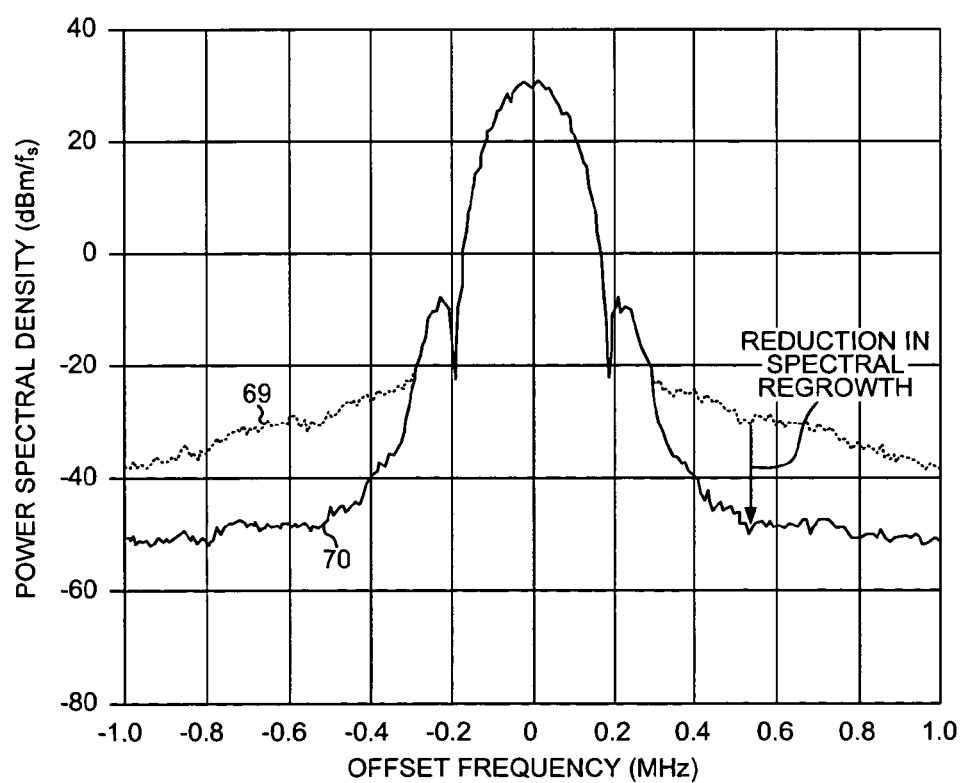
FIG. 8 is a diagram of the power spectral density of a transmitted signal generated from the signal output by the phase modulator of FIG. 3 with and without the group delay compensation provided by the baseband filters.

FIG. 8 shows the output spectrum of a transmitted RF signal output by a polar transmitter that performs amplitude modulation on RF signal 25. Distortion in the transmitted RF signal caused by the group delay of OPLL 21 has been compensated by a first group delay introduced by baseband filters 22-23. A curve 69 shows that the transmitted RF signal exhibits a significant amount of spectral energy at offset frequencies more than ±0.3 MHz from the carrier frequency when baseband filters 22-23 have a very wide bandwidth. In this example, the carrier frequency is 900 MHz, and the very wide bandwidth is greater than 4.5 MHz. A curve 70 shows that the amount of spectral energy at offset frequencies ±0.3 MHz from the carrier frequency has been reduced by filtering baseband I signal 42 and baseband Q signal 43. By filtering the I and Q signals 42-43 with baseband filters 22-23 having a bandwidth of about 540 kHz, a reduction of about 10-20 dB in power spectral density was achieved in the skirts of the output spectrum of the transmitted RF signal. In addition to specifying the maximum thresholds of phase error and transmitted noise, the EDGE standard also specifies the minimum signal attenuation that must be achieved at defined offset frequencies. At an offset frequency of ±0.6 MHz, for example, the spectral regrowth in curve 69 is above the threshold permitted by the EDGE standard, whereas the spectral regrowth in curve 70 complies with the EDGE standard by using baseband filtering to compensate for non-linear group delay. The reduction in spectral regrowth indicates that phase modulator 20 performs a more faithful reproduction of the phase modulation imparted by quadrature modulator 34 when the amplitudes of baseband I and Q signals 42-43 are first filtered.

The method of FIG. 6 reduces the phase error in RF signal 25 and the spectral energy in the transmitted RF signal at offset frequencies from the carrier frequency by compensating for the non-constant group delay of OPLL 21. By reducing spectral regrowth at offset frequencies without passing excessive noise through OPLL 21, the usable loop bandwidth of the polar EDGE transmitter containing phase modulator 20 is expanded. In the time domain, expanding the bandwidth for which both phase error and transmitted noise are below the specified thresholds corresponds to reducing spectral regrowth in the frequency domain. The increased usable loop bandwidth allows the use of even higher frequency modulation schemes than the present modulation and coding schemes that employ 8-PSK modulation. The higher frequency modulation schemes will permit higher data rates that more closely approach the upper limit of data rates set by the allocated spectral bandwidth.

Although the present invention has been described in connection with certain specific embodiments for instructional purposes, the present invention is not limited thereto. The method of reducing phase error and spectral regrowth without passing excessive noise through an offset phase-locked loop is described in connection with a phase modulator in a mobile station. The method may also be practiced in a base station that transmits phase-modulated RF signals to mobile stations. Although phase modulator 20 is described as part of a polar EDGE transmitter, phase modulator 20 is also usable in transmitters that comply other wireless standards that employ both amplitude and phase modulation, such as the CDMA standards: (1) the IS-95 standard promulgated by the Telecommunications Industry Association/Electronic Industry Association, (2) the related IS-98 standard for mobile station modems, (3) the standard offered by a consortium named "3$^{rd}$ Generation Partnership Project" (3GPP) (the W-CDMA standard) and (4) the standard offered by a consortium named "3$^{rd}$ Generation Partnership Project 2" (3GPP2) (the IS-2000 standard). In the embodiment of phase modulator 20 described above, baseband filters 22-23 filter analog baseband I and Q signals 42-43. In other embodiments, baseband filters that introduce a compensating group delay filter digital I and Q signals output by digital I/Q generator 38.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Accordingly, the present invention is not intended to be limited to the embodiments shown herein but is to be accorded the widest scope consistent with the principles and novel features disclosed herein.

The invention claimed is:

1. A method comprising:

phase modulating a filtered baseband signal with a quadrature modulator to generate a passband signal, wherein the passband signal has an amplitude and a phase;

limiting the amplitude of the passband signal with a limiter to generate a limited passband signal;

filtering the limited passband signal with a phase-locked loop (PLL) to generate an output signal and thereby introducing a PLL group delay; filtering a baseband signal with a baseband filter to generate the filtered baseband signal, wherein the baseband filter introduces a baseband-filter group delay, and wherein the baseband-filter group delay compensates for the PLL group delay; wherein the output signal is used by a polar transmitter to generate a transmitted signal, wherein the transmitted signal exhibits an amount of spectral energy at an offset frequency, and wherein the baseband-filter group delay compensates for the PLL group delay such that the amount of spectral energy at the offset frequency is reduced; and further wherein the passband signal has a modulation frequency, wherein the baseband-filter group delay has a maximum value when the modulation frequency is zero Hertz, wherein the PLL group delay has a maximum value when the modulation frequency is a first value, and wherein the maximum value of the baseband-filter group delay is approximately equal to the maximum value of the PLL group delay.

2. The method of claim 1, wherein the output signal exhibits distortion, and wherein the baseband-filter group delay compensates for the PLL group delay such that the distortion is reduced.

3. The method of claim 1, wherein the passband signal has a modulation frequency, wherein the baseband filter, the quadrature modulator, the limiter and the PLL together exhibit a combined group delay, and wherein the combined group delay remains substantially constant as the modulation frequency of the passband signal varies.

4. The method of claim 1, wherein the filtering the limited passband signal is performed by an offset phase-locked loop.

5. The method of claim 1, wherein the output signal is used by a polar transmitter to generate a transmitted signal and wherein the transmitted signal is a radio frequency (RF) signal, further comprising:

transmitting the transmitted signal from a mobile station.

6. The method of claim 1, wherein the baseband signal is an in-phase (I) signal, and wherein the passband signal is an intermediate frequency (IF) signal.

7. The method of claim 1, wherein the baseband signal is a quadrature (Q) signal, wherein the filtering the baseband signal filters Cartesian coordinates, wherein the limited passband signal has a phase, and wherein the filtering the limited passband signal filters the phase of the limited passband signal.

8. The method of claim 1, wherein the phase modulating the filtered baseband signal performs octal phase shift keying (8-PSK).

9. A method of comprising:
generating a passband signal by phase modulating a first baseband signal and a second baseband signal, wherein the passband signal has an amplitude and a phase;
generating a limited passband signal by limiting the amplitude of the passband signal;
generating an output signal by filtering the limited passband signal with a phase-locked loop, wherein the output signal exhibits an amount of phase error; reducing the amount of phase error by filtering the first baseband signal and the second baseband signal, thereby introducing a group delay; wherein the output signal is used by a polar transmitter to generate a transmitted signal, wherein the transmitted signal exhibits an amount of spectral energy at an offset frequency, and wherein the spectral energy at the offset frequency is reduced by filtering the first baseband signal and the second baseband signal; and further wherein the passband signal has a modulation frequency, wherein the group delay has a maximum value when the modulation frequency is zero Hertz, wherein the phase error has a maximum value when the modulation frequency is a first value, and wherein the maximum value of the group delay is approximately equal to the maximum value of the phase error.

10. The method of claim 9, wherein the first baseband signal is an in-phase (I) signal and the second baseband signal is a quadrature (Q) signal.

11. The method of claim 9, wherein the passband signal is a phase-modulated intermediate frequency (IF) signal.

12. The method of claim 9, wherein the limited passband signal has a phase, and wherein the filtering the limited passband signal filters the phase.

13. The method of claim 12, wherein the filtering the first baseband signal and the second baseband signal filters Cartesian coordinates.

14. A method comprising:
(a) generating I and Q signals;
(b) generating filtered I and Q signals by filtering the I and Q signals with a baseband filter;
(c) generating a phase-modulated intermediate frequency (IF) signal from the filtered I and Q signals; (d) generating an output signal by filtering the phase-modulated IF signal in an offset phase-locked loop (OPLL), wherein the OPLL has a bandwidth, wherein the output signal exhibits phase error, and wherein the phase error increases as the bandwidth of the OPLL decreases; wherein the output signal is used by a polar transmitter to generate a transmitted signal, wherein the transmitted signal exhibits an amount of spectral energy at an offset frequency, and wherein the amount of spectral energy at the offset frequency decreases as the bandwidth of the baseband filter decreases; further wherein the phase-modulated IF signal has a modulation frequency, wherein the baseband filter exhibits a first group delay and the OPLL exhibits a second group delay, wherein when the modulation frequency is zero Hertz the first group delay has a first maximum value and the second group delay has a minimum value, wherein the second group delay has a second maximum value; and further comprising: (e) adjusting the baseband filter such that the first maximum value approximately equals the second maximum value.

15. The method of claim 14, wherein the baseband filter exhibits a first group delay and the OPLL exhibits a second group delay, wherein the phase-modulated IF signal has a modulation frequency, wherein the second group delay has a minimum value when the modulation frequency is zero Hertz and a maximum value when the modulation frequency is a non-zero value, further comprising:
(e) reducing the phase error by adjusting the baseband filter such that when the modulation frequency is zero Hertz the first group delay has a value approximately equal to the maximum value of the second group delay when the modulation frequency is the non-zero value.

16. The method of claim 14, wherein the phase-modulated IF signal has an amplitude and a phase, further comprising between (c) and (d):
(e) limiting the amplitude of the phase-modulated IF signal.

17. The method of claim 14, wherein the I and Q signals are baseband signals, and wherein the phase-modulated IF signal is a passband signal.

18. The method of claim 14, wherein the OPLL exhibits a group delay with a maximum value, wherein the maximum value of the group delay has a reciprocal, wherein the baseband filter has a bandwidth that is at least as large as the reciprocal of the maximum value of the group delay.

19. A device comprising:
(a) means for filtering a baseband signal to generate a filtered baseband signal, wherein the filtered baseband signal exhibits a first group delay;
(b) means for phase modulating the filtered baseband signal to generate a passband signal, wherein the passband signal has an amplitude, a phase and a modulation frequency;
(c) means for limiting the amplitude of the passband signal to generate a limited passband signal; (d) means for filtering the limited passband signal and thereby introducing a second group delay, wherein the means for filtering the baseband signal, the means for phase modulating, the means for limiting and the means for filtering the limited passband signal exhibit a combined group delay, and wherein the combined group delay remains substantially constant as the modulation frequency of the passband signal varies; wherein the means for filtering in (d) generates an output signal, wherein the output signal is used by a polar transmitter to generate a transmitted signal and further the means for filtering comprises an offset phase-locked loop, further comprising:
(e) means for transmitting the transmitted signal from a mobile station; and further wherein the first group delay has a maximum value when the modulation frequency is zero Hertz, wherein the second group delay has a maximum value when the modulation frequency is a first value, and wherein the maximum value of the first group delay is approximately equal to the maximum value of the second group delay.

20. The device of claim 19, wherein the means for phase modulating performs octal phase shift keying (8-PSK).

21. A circuit comprising:
a baseband filter that receives I and Q signals and outputs filtered I and Q signals, wherein the baseband filter exhibits a first group delay;
a quadrature modulator that receives the filtered I and Q signals and outputs a phase-modulated passband signal;
an offset phase-locked loop (OPLL) that filters the phase-modulated passband signal and outputs an output signal, wherein the output signal exhibits an amount of phase error, wherein the OPLL exhibits a second group delay, and wherein the first group delay compensates for the second group delay such that the amount of phase error is reduced; wherein the output signal is used by a polar transmitter to generate a transmitted signal, wherein the transmitted signal exhibits an amount of spectral energy at an offset frequency, and wherein the first group delay compensates for the second group delay such that the amount of spectral energy at the offset frequency is reduced; and further wherein the phase-modulated passband signal has a modulation frequency, wherein when the modulation frequency is zero Hertz the first group delay has a maximum value and the second group delay has a minimum value, wherein the second group delay has a maximum value at a non-zero frequency, and wherein the maximum value of the first group delay approximately equals the maximum value of the second group delay.

22. The circuit of claim 21, wherein the phase-modulated passband signal has an amplitude and a phase, further comprising:
a limiter that limits the amplitude of the phase-modulated passband signal that is filtered by the OPLL.

23. The circuit of claim 21, wherein the OPLL has a bandwidth, wherein the output signal exhibits phase error, and wherein the phase error increases as the bandwidth of the OPLL decreases.

24. The circuit of claim 21, wherein the OPLL has a bandwidth, wherein the output signal exhibits noise, and wherein the noise decreases as the bandwidth of the OPLL decreases.

25. The circuit of claim 21, wherein the quadrature modulator performs octal phase shift keying (8-PSK).

26. The circuit of claim 21, wherein the second group delay has a maximum value that occurs between zero Hertz and 1 Megahertz.

27. The circuit of claim 21, wherein the phase-modulated passband signal has an amplitude and a phase, and wherein the OPLL filters the phase of the phase-modulated passband signal.

28. The circuit of claim 21, wherein the phase-modulated passband signal is an intermediate frequency (IF) signal.

29. A circuit comprising:
a phase-locked loop (PLL) with a voltage-controlled oscillator (VCO) and a loop filter, wherein the PLL receives a phase-modulated passband signal and the VCO outputs an output signal with a frequency, wherein the loop filter outputs a filtered signal, wherein the frequency of the output signal is controlled entirely by the filtered signal, wherein the PLL has a bandwidth, wherein the output signal exhibits noise and phase error, and wherein the phase error increases and the noise decreases as the bandwidth of the PLL decreases; means for simultaneously decreasing the noise and the phase error; wherein the means reduces the phase error of the output signal without increasing the bandwidth of the PLL; and further wherein the means comprises a baseband filter, wherein the PLL exhibits a group delay with a maximum value, wherein the maximum value of the group delay has a reciprocal, wherein the baseband filter has a bandwidth that is at least as large as the reciprocal of the maximum value of the group delay, wherein the output signal is used by a polar transmitter to generate a transmitted signal, wherein the transmitted signal exhibits an amount of spectral energy at an offset frequency, and wherein the amount of spectral energy at the offset frequency decreases as the bandwidth of the baseband filter decreases.

30. The circuit of claim 29, wherein the PLL is an offset phase-locked loop.

* * * * *